United States Patent
Johnson

(10) Patent No.: US 9,629,280 B2
(45) Date of Patent: Apr. 18, 2017

(54) MULTIPLE LIQUID LOOP COOLING FOR ELECTRONICS

(75) Inventor: Scott T. Johnson, Torrance, CA (US)

(73) Assignee: RAYTHEON COMPANY, Waltham, MA (US)

( * ) Notice: Subject to any disclaimer, the term of this patent is extended or adjusted under 35 U.S.C. 154(b) by 721 days.

(21) Appl. No.: 12/823,097

(22) Filed: Jun. 24, 2010

(65) Prior Publication Data
US 2011/0315354 A1 Dec. 29, 2011

(51) Int. Cl.
F28D 15/00 (2006.01)
F28F 7/00 (2006.01)
H05K 7/20 (2006.01)

(52) U.S. Cl.
CPC ..... H05K 7/20254 (2013.01); H05K 7/20636 (2013.01)

(58) Field of Classification Search
CPC .............. H05K 7/20254; H05K 7/20636
USPC ............. 165/104.31, 104.33, 80.3, 80.4; 361/679.53, 689, 698, 699, 701; 174/15.1
See application file for complete search history.

(56) References Cited

U.S. PATENT DOCUMENTS

| | | | | |
|---|---|---|---|---|
| 3,481,393 A | * | 12/1969 | Chu | 165/80.4 |
| 5,343,358 A | * | 8/1994 | Hilbrink | 361/700 |
| 5,459,474 A | * | 10/1995 | Mattioli | H01Q 21/0087 343/702 |
| 6,035,655 A | * | 3/2000 | Hare et al. | 62/259.2 |
| 6,182,742 B1 | * | 2/2001 | Takahashi et al. | 165/104.33 |
| 6,330,155 B1 | * | 12/2001 | Remsburg | 361/695 |
| 6,744,630 B2 | * | 6/2004 | Hutchinson | G06F 1/183 165/120 |
| 6,927,980 B2 | * | 8/2005 | Fukuda et al. | 361/700 |
| 6,967,841 B1 | * | 11/2005 | Chu et al. | 361/700 |
| 7,474,526 B2 | * | 1/2009 | Fujiwara | 165/104.33 |
| 7,486,517 B2 | * | 2/2009 | Aapro et al. | 361/714 |
| 7,675,750 B1 | * | 3/2010 | Tamarkin | H05K 7/20736 165/104.33 |
| 7,944,694 B2 | * | 5/2011 | Campbell | H05K 7/20809 165/104.33 |

(Continued)

OTHER PUBLICATIONS

Extended European Search Report for European Application No. 11163419.2-2214, Extended European Search Report dated Oct. 28, 2011 and mailed Nov. 4, 2011 (5 pgs.).

(Continued)

*Primary Examiner* — Len Tran
*Assistant Examiner* — Claire Rojohn, III
(74) *Attorney, Agent, or Firm* — Lewis Roca Rothgerber Christie LLP

(57) ABSTRACT

The present invention relates to liquid cooling systems and more particularly to a liquid cooling system for an electrical system on an air-cooled platform. In one embodiment of the invention, a liquid-cooled system for a platform with air cooling includes an electrical system comprising first and second electrical components; a cooling unit comprising an air flow path, a first heat exchanger in the air flow path, and a second heat exchanger in the air flow path downstream of the first heat exchanger; a first liquid loop passing through the first heat exchanger and the first electrical component; and a second liquid loop passing through the second heat exchanger and the second electrical component. The first liquid loop is substantially thermally isolated from the second liquid loop.

15 Claims, 3 Drawing Sheets

(56) References Cited

U.S. PATENT DOCUMENTS

| | | | |
|---|---|---|---|
| 8,018,718 B2 * | 9/2011 | Goth | F25B 49/02 165/80.3 |
| 8,077,463 B2 * | 12/2011 | Lee | G06F 1/20 165/104.33 |
| 2005/0039888 A1 * | 2/2005 | Pfahnl | F25B 23/006 165/104.33 |
| 2007/0044493 A1 | 3/2007 | Kearney et al. | |
| 2007/0091564 A1 * | 4/2007 | Malone | H05K 7/20727 361/695 |
| 2007/0235167 A1 * | 10/2007 | Brewer | G06F 1/20 165/104.33 |
| 2008/0041562 A1 * | 2/2008 | Bhatia | G06F 1/20 165/80.3 |
| 2008/0055845 A1 * | 3/2008 | Murakami et al. | 361/687 |
| 2009/0027856 A1 * | 1/2009 | McCoy | G06F 1/20 361/699 |
| 2009/0071636 A1 * | 3/2009 | Novotny | 165/104.33 |
| 2009/0095451 A1 * | 4/2009 | Moroz | 165/104.33 |
| 2009/0126910 A1 * | 5/2009 | Campbell | H05K 7/20781 165/104.33 |
| 2009/0219681 A1 | 9/2009 | Goth et al. | |
| 2011/0013364 A1 * | 1/2011 | Howes | H05K 7/20936 361/700 |

OTHER PUBLICATIONS

Brochure "New HRU-1000 Advanced Heat Rejection Unit for Electronics", Parker Hannifin Corporation, Copyright 2005 (2 pgs.).

* cited by examiner

MULTIPLE LIQUID LOOP COOLING FOR ELECTRONICS

FIELD OF THE INVENTION

The present invention relates to liquid cooling systems and more particularly to a liquid cooling system for an electrical system on an air-cooled platform.

BACKGROUND

Various aircraft are equipped with on-board air-cooling systems to cool electronic equipment or electrical systems on the aircraft, such as the aircraft's radar system. The air flow is routed through the aircraft through various ducts to the hot electrical components that need to be cooled. The air absorbs heat from these components, and then the heated air is released from the aircraft as exhaust.

However, some electrical systems benefit from or require liquid cooling. For example, some phased (or "active") antenna array radar systems benefit from liquid cooling, which enables the electrical components of the radar system to operate at higher power, as compared to air-cooled systems, without overheating. Therefore, to install such a radar system on an air-cooled aircraft, a liquid-to-air cooling system is needed, in order to transfer heat from the liquid-cooled radar system to the on-board air flow.

While such liquid-to-air cooling systems have been designed to enable a liquid-cooled component to be installed on an air-cooled platform, these systems are limited by the available amount of air flow onboard the platform. In some situations, the available air flow is not able to remove sufficient heat from the liquid cooling loop, and the electrical components in the liquid-cooled system overheat, or are operated at sub-optimal power levels to avoid overheating. Accordingly there is still a need for an improved liquid-to-air cooling system for installing a liquid-cooled electrical system on an air-cooled platform.

SUMMARY

The present invention relates to liquid cooling systems and more particularly to a liquid cooling system for an electrical system on an air-cooled platform. In one embodiment, a liquid cooling system includes two separate liquid cooling loops for cooling the electrical system. A first liquid cooling loop cools the thermally sensitive components (which operate at lower temperatures) in the electrical system, absorbing heat from these components and delivering the heat to the on-board air flow through a first heat exchanger. A separate, second cooling loop cools the more thermally robust components of the electrical system (which can operate at higher temperatures than the thermally sensitive components), delivering the heat from these components to the on-board air flow through a second heat exchanger downstream of the first heat exchanger. The air flow passes over the two heat exchangers in series. Thus, the exhaust air from the first heat exchanger provides the cooling air for the second heat exchanger. Because the thermally sensitive components are cooled first, by incoming air flow that has not yet absorbed heat from the higher temperature electrical components, and by a liquid cooling loop that is thermally isolated from the higher-temperature electrical components, the thermally sensitive components can be cooled to a lower temperature with the available on-board airflow, as compared to prior art systems.

In one embodiment of the invention, a liquid-cooled system for a platform with air cooling includes an electrical system comprising first and second electrical components; a cooling unit comprising an air flow path, a first heat exchanger in the air flow path, and a second heat exchanger in the air flow path downstream of the first heat exchanger; a first liquid loop passing through the first heat exchanger and the first electrical component; and a second liquid loop passing through the second heat exchanger and the second electrical component. The first liquid loop is substantially thermally isolated from the second liquid loop.

According to another embodiment of the invention, there is provided a liquid cooling unit for an electrical system having first and second electrical components on an air-cooled platform. The liquid cooling unit includes an air inlet; an air outlet; an air flow path between the air inlet and the air outlet, for passage of an air flow from the platform; a first liquid inlet and a first liquid outlet, for connection to such first electrical component; a second liquid inlet and a second liquid outlet, for connection to such second electrical component; a first heat exchanger in the air flow path; a second heat exchanger in the air flow path downstream of the first heat exchanger; a first liquid flow path from the first liquid inlet through the first heat exchanger to the first liquid outlet; and a second liquid flow path from the second liquid inlet through the second heat exchanger to the second liquid outlet. The first liquid flow path is substantially thermally isolated from the second liquid flow path.

According to another embodiment of the invention, a method is provided for cooling a liquid-cooled electrical system on a platform with air cooling. The method includes providing an electrical system comprising first and second electrical components; providing a cooling unit comprising an air flow path; passing a first liquid coolant through a first liquid loop through the first electrical component; passing a second liquid coolant through a second liquid loop through the second electrical component; and passing air flow through the air flow path of the cooling unit. The air flow path passes over the first liquid loop and the second liquid loop in series, with the second liquid loop downstream of the first liquid loop. The first liquid loop is substantially thermally isolated from the second liquid loop. The method further includes exchanging heat from the first liquid loop to the air flow, producing an intermediate heated air flow, and then exchanging heat from the second liquid loop to the intermediate heated air flow.

DETAILED DESCRIPTION

The present invention relates to liquid cooling systems and more particularly to a liquid cooling system for an electrical system on an air-cooled platform. In one embodiment, a liquid cooling system includes two separate liquid cooling loops for cooling the electrical system. A first liquid cooling loop cools the thermally sensitive components (which operate at lower temperatures) in the electrical system, absorbing heat from these components and delivering the heat to the on-board air flow through a first heat exchanger. A separate, second cooling loop cools the more thermally robust components of the electrical system (which can operate at higher temperatures than the thermally sensitive components), delivering the heat from these components to the on-board air flow through a second heat exchanger downstream of the first heat exchanger. The air flow passes over the two heat exchangers in series. Thus, the exhaust air from the first heat exchanger provides the cooling air for the second heat exchanger. Because the thermally sensitive components are cooled first, by incoming air flow that has not yet absorbed heat from the higher temperature electrical components, and by a liquid cooling loop that is thermally isolated from the higher-temperature electrical components, the thermally sensitive components can be cooled to a lower temperature with the available on-board airflow, as compared to prior art systems.

Figure 1:
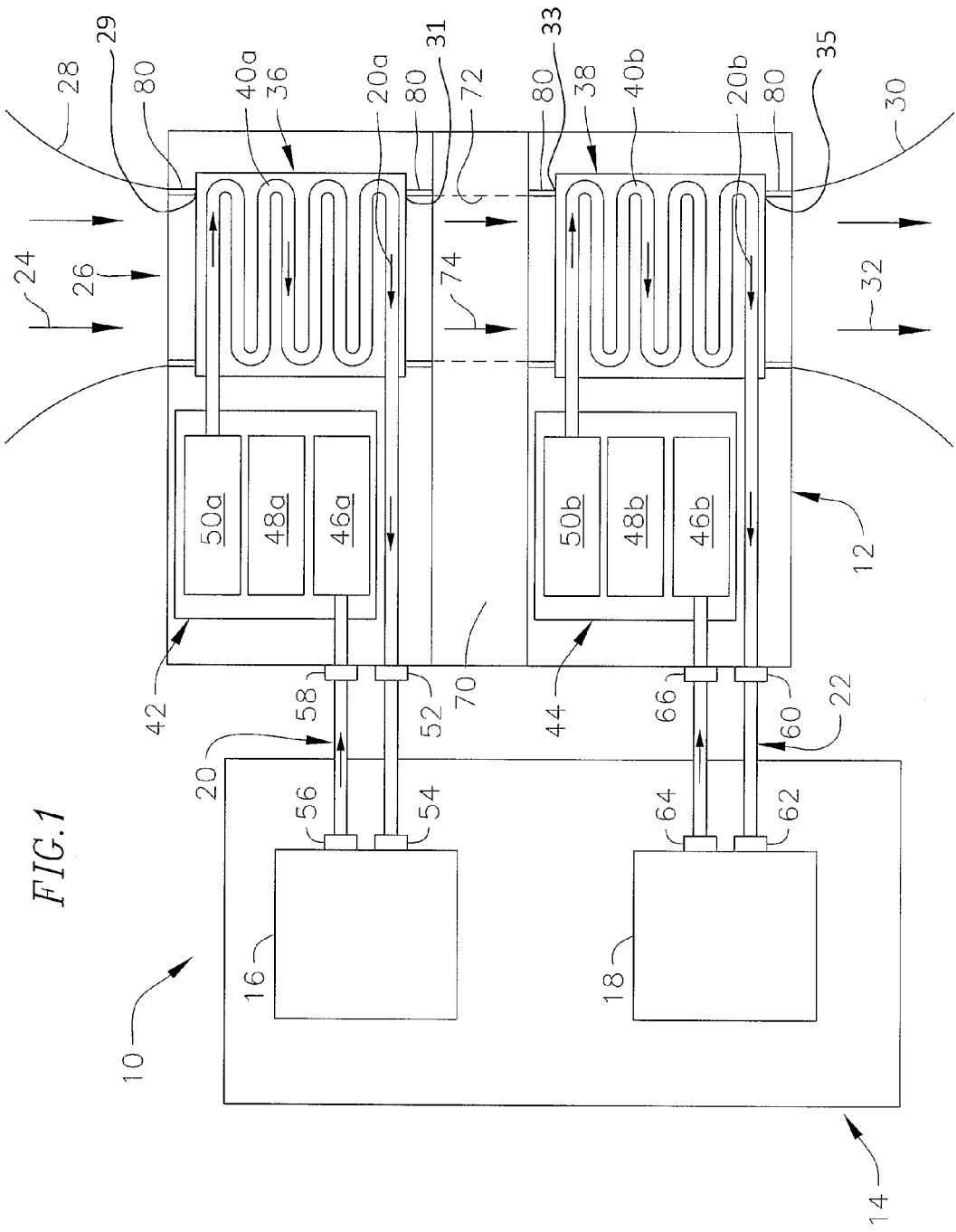
FIG. 1 is a schematic view of a liquid cooling system according to an embodiment of the invention.

A schematic view of a liquid cooling system 10 according to an embodiment of the invention is shown in FIG. 1. The liquid cooling system 10 includes a liquid-to-air cooling unit 12 connected to a liquid-cooled electrical system 14. The electrical system 14 includes at least two electrical components 16 and 18. The first electrical component 16 is relatively thermally sensitive, as compared to the second electrical component 18, which is relatively thermally robust. That is, the first (thermally sensitive) electrical component 16 is more sensitive to high temperature than the second (thermally robust) electrical component 18. The first component 16 is designed to be operated at a lower temperature than is the second component 18.

For example, in one embodiment the electrical system 14 is a sensor system. The first component 16 is the sensor, such as an optical, laser, or other sensor. The second component includes supporting electronic equipment, such as a power supply or processor. For example, the first component 16 may be a receiver for a radar system, and the second component 18 may be the antenna array. The first component 16 (such as the sensor) is designed to operate at low temperature, and its performance and reliability are degraded at high temperature. The second component 18 is less sensitive to temperature, and can operate at higher temperature than the first component. Thus, relative to each other, the first component 16 is thermally sensitive, and the second component 18 is thermally robust. These terms "thermally sensitive" and "thermally robust" are used herein to identify the electrical components within the electrical system 14 and to compare the temperature sensitivities of these components to each other. The electrical system 14 has at least one first component that is "thermally sensitive" compared to a second component, which is "thermally robust" compared to the first. These terms identify one or more components with different temperature requirements.

The liquid-to-air cooling unit 12 includes two separate liquid cooling loops, which separately cool the first and second electrical components 16, 18. A first liquid loop 20 passes through the first electrical component 16, and a separate, second liquid loop 22 passes through the second electrical component 18. By separating these two loops 20, 22 from each other, the two cooling loops can operate at different temperatures, and heat from the second cooling loop 22 is isolated from the first loop 20. Additionally, by passing both of these cooling loops 20, 22 through the cooling unit 12 in series, the on-board air flow on the platform cools both loops 20, 22 to a sufficiently low temperature for the electrical components on that loop.

The platform provides incoming air flow 24 from the on-board air cooling system. This incoming air 24 passes through an air flow path 26 through the liquid-to-air cooling unit 12, entering the cooling unit at an air inlet 28 and exiting at an air outlet 30. In one embodiment, the air inlet 28 and the air outlet 30 are ducts, tubes, or other suitable passages for routing air flow to and from the cooling unit. The air exiting the air outlet 30 is heated exhaust air 32, which is released from the platform to the surrounding environment. The exhaust air 32 carries heat from the electrical system 14 and removes this heat from the system 10.

The air flow path 26 passes through two heat exchangers in the cooling unit 12, one for each liquid cooling loop 20, 22. The air path 26 first passes through a first heat exchanger 36 that is fluidically connected to the first cooling loop 20 (e.g., incoming air 24 enters the air inlet 28 and flows into a first air inlet 29 of the first heat exchanger and out of a first air outlet 31 of the first heat exchanger). Liquid coolant 40a in the first loop 20 passes through the first electrical component 16 and absorbs heat from this component, and then passes through the first heat exchanger 36 and dissipates this heat to the air flow. The air flow continues on through a second heat exchanger 38, downstream of the first heat exchanger 36 (e.g., air from the first air outlet 31 of the first heat exchanger flows into a second air inlet 33 of the second heat exchanger and out of a second air outlet 35 of the second heat exchanger to the air outlet 30). Liquid coolant 40b in the second loop 22 passes through the second electrical component 18 and absorbs heat from this component, and then passes through the second heat exchanger 38 and dissipates this heat to the air flow. The heated exhaust air 32 then exits the cooling unit 12 through the air outlet 30.

In one embodiment, the liquid-to-air cooling unit 12 also includes a flow control unit for each liquid loop. A first flow control unit 42 is fluidically connected in the first loop 20 in series between the first electrical component 16 and the first heat exchanger 36. A second flow control unit 44 is fluidically connected in the second loop 22 in series between the second electrical component 18 and the second heat exchanger 38. The flow control units 42, 44 include various sub-components that regulate the flow of the coolants 40a, 40b through the respective loops 20, 22. These sub-components may include a pump 46a/b, a filter 48a/b, and/or an accumulator 50a/b. These sub-components can be included in any appropriate order or arrangement, parallel or in series, as necessary, to regulate the flow. For example, in one embodiment, the sub-components are connected in series with the pump 46a/b followed by the filter 48a/b and then the accumulator 50a/b. In other embodiments these sub-components can be arranged in other configurations. In other embodiments more or fewer pumps may be included, and other sub-components may be added or removed, such as adding one or more sensors or valves, or removing the filter. In one embodiment, the flow control unit is provided together as one consolidated unit, with the various sub-components packaged together in one housing. In one embodiment, the flow control unit includes a pump, and optionally includes one or more of an accumulator, a filter, and/or various sensors or valves.

Each liquid loop will now be described in one complete cycle through the loop. The first loop 20 includes liquid coolant 40a passing through a first flow path 20a through the loop 20. The coolant 40a passes through a first liquid outlet 52 on the cooling unit 12, and into a liquid inlet 54 in the first electrical component 16. The coolant 40a is then routed through the first electrical component 16, through its internal coolant passageways, to absorb heat from this component 16. The heated coolant 40a then passes through a liquid outlet 56 on the first electrical component 16 and then into a first liquid inlet 58 on the cooling unit 12. From there the coolant passes through the flow control unit 42, which in one embodiment includes the pump 46a, filter 48a, and accumulator 50a in series. The heated coolant 40a then passes through the first heat exchanger 36, where it releases the heat absorbed from the electrical component 16 to the air flowing through the air flow path 26. The cooled coolant 40a then returns through the loop 20, exiting through the first liquid outlet 52 and returning to the first electrical component 16.

The second loop 22 includes liquid coolant 40b that passes through a similar loop. The coolant 40b passes through a second flow path 20b through the loop 22, passing through a second liquid outlet 60 on the cooling unit 12, into a liquid inlet 62 in the second electrical component 18, through the second electrical component 18, and out a liquid outlet 64 of the second electrical component. The coolant 40b enters a second liquid inlet 66 on the cooling unit 12 and passes through the flow control unit 44. The coolant 40b then passes through the second heat exchanger 38 where it dissipates heat from the second electrical component 18 to the air flow. The cooled coolant 40b then exits at the second outlet 60 and repeats the cycle.

The first liquid loop 20 is substantially thermally isolated from the second loop 22, meaning that the temperature of the second loop 22 does not affect the temperature of the first loop 20. Thus the two loops 20, 22 can operate at different temperatures. The second (thermally robust) electrical component 18 on the second loop 22 can operate at a higher temperature than the first (thermally sensitive) electrical component 16, without over-heating the liquid loop that cools the first component. The higher temperature of the second loop does not affect the first loop.

The liquid-to-air cooling unit 12 includes a thermal barrier 70 (e.g., a barrier to the conduction of thermal energy) between the two loops 20, 22 to prevent heat from flowing directly between the coolant 40a, 40b in the two loops. The thermal barrier 70 is a material that does not conduct heat. In one embodiment, the thermal barrier 70 is a non-metal gasket, such as a rubber or plastic polymer. In one embodiment, the thermal barrier 70 is a flexible bellows. In one embodiment, the thermal barrier 70 is a non-metal material with low- or non-conductivity, such as a polymer. This material contains (or directs) the airflow between the two loops while also thermally separating the two loops 20, 22 so that they do not directly pass heat between them. Without this thermal isolation, heat from the second (higher temperature) loop could pass to the first loop and raise the temperature of the first loop beyond the desired temperature for the first component 16.

Because the first loop 20 is thermally isolated from the second loop 22, the incoming air flow 24 does not need to cool the second loop 22 to a temperature low enough for operation of the first electrical component 16. As a result, the liquid-cooled electrical system 14 can be installed on an air-cooled platform in which the available air flow is not sufficient to cool both loops 20, 22 to the low temperature required by the sensitive electrical component 16. For comparison, if the electrical system 14 had only a single cooling loop passing through both components 16, 18 to cool those components (or if the two loops 20, 22 were not thermally isolated from each other), then such a platform would be unable to cool the system 14 to a low enough temperature for operation of the first component 16. With both components 16, 18 on a single loop (or on two thermally non-isolated loops), the additional heat from the second (higher temperature) component 18 needs to be completely dissipated so that it does not overheat the first component.

By dividing the components 16, 18 into separate liquid loops arranged in series in the air flow through the cooling unit 12, the same amount of on-board air flow (that would be insufficient to cool a single-loop system) can be used to cool both components 16 and 18 to their respective acceptable temperatures. The entire volume of incoming air 24 flows through the first heat exchanger 36, absorbing heat from the first component 16 and cooling this component to a low temperature. The cooling capability of this incoming air 24 is not affected by the downstream loop 22 and the higher temperature of the second component 18. Instead, the full cooling capacity of the incoming air 24 is first used to cool the sensitive electrical component 16. As a result, even if this cooling capacity were not sufficient to cool the entire system 14 to the low temperature of the first component 16, it can be used to cool the first loop 20 to that low temperature.

After absorbing heat from this first loop 20 and cooling the first loop 20 to the low temperature needed by the first (thermally sensitive) electrical component 16, the air flow continues through the air path 26 to the second heat exchanger 38. The air exiting the first heat exchanger 36 is intermediate exhaust air 74, which has absorbed heat from the first heat exchanger 36 and therefore is elevated in temperature compared to the incoming air 24. However it has not yet passed through the second heat exchanger 38 and therefore is not as hot as the exhaust air 32 exiting the system.

The intermediate exhaust air 74 flows through the second heat exchanger 38 and absorbs heat from the second electrical component 18 via the second loop 22. As mentioned, the intermediate exhaust air 74 is elevated in temperature as compared to the incoming air 24, due to the heat from the first component 16. However, because the first component 16 operates at a lower temperature than the second component 18, the intermediate exhaust air 74 remains lower in temperature than the coolant 40b in the second heat exchanger 38. Thus, even though the intermediate air 74 has been pre-heated by the first loop 20 prior to cooling the second loop 22, it is still able to cool the second loop 22. The air flows through the second heat exchanger 38, absorbing heat from the second loop 22, and then exits the system through the air outlet 30.

The air flow path 26 through the liquid cooling unit 12 includes a passage 72 between the two loops, between the two heat exchangers 36, 38. This passage 72 allows the air to flow over the two heat exchangers in series. The passage 72 may be the physical implementation of the bellows or other thermal barrier element preventing conduction heat transfer between the heat exchangers 36, 38, as described above.

The incoming air flow 24 passes through the two heat exchangers 36, 38 in series, and the exhaust air 74 from the first heat exchanger 36 is the incoming air for the second heat exchanger 38. As mentioned above, although the incoming air for the second heat exchanger is pre-heated by the first heat exchanger, it is able to cool the second heat exchanger because the second component 18 operates at a higher temperature than the first component 16. Thus, the components 16, 18 are divided from each other based on their operating temperature, with the lower temperature component(s) located on the first loop 20 and the higher temperature component(s) located on the second loop 22. With the components in this order, the air flow 24 can cool both loops sequentially.

More than one electrical component may be provided on each loop 20, 22. In fact, many liquid-cooled electrical systems 14 have multiple components that are cooled by the liquid coolant. According to an embodiment of the invention, these components are grouped by operating temperature, with the lower-temperature components grouped together on the first loop and the higher-temperature components grouped together on the second loop. These components can be arranged in series or parallel on their respective loops. In one embodiment, the operating temperature of the components on the first loop is about 20° C. lower than the operating temperature of the components on the second loop. In another embodiment the difference is about 30° C. For example, in one embodiment the first group of components 14 operate at about 40° C., and the second group of components 16 at about 70° C. In another embodiment the operating temperature of the components on the first loop is at least 20° C. lower, or at least 30° C. lower, than the operating temperature of the components on the second loop.

Figure 2:
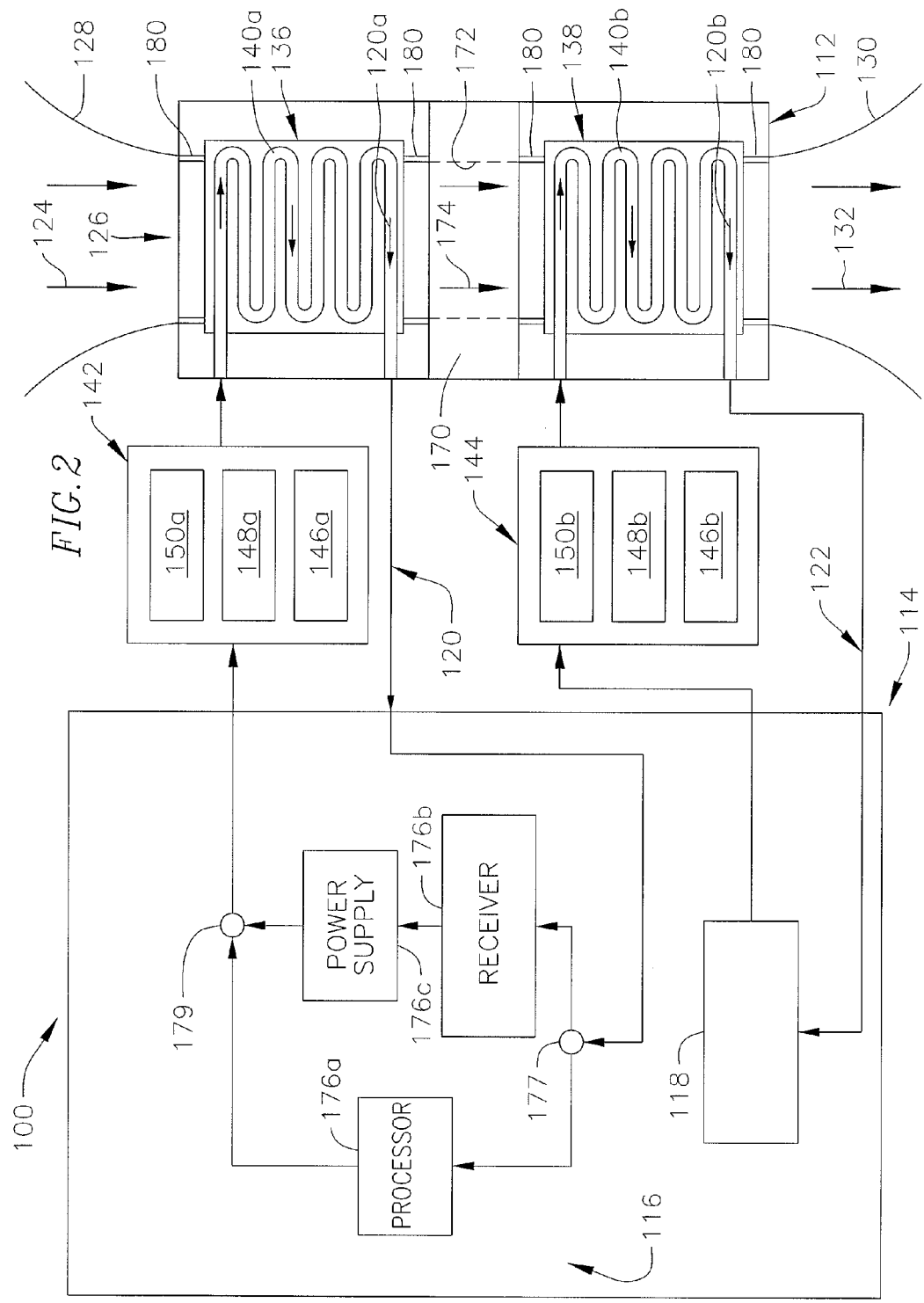
FIG. 2 is a schematic view of a liquid cooling system according to another embodiment of the invention.

Another embodiment of a liquid cooling system is shown in FIG. 2. In this embodiment, a liquid cooling system 100 includes an electrical system 114 with several electrical components (collectively, the first components 116) on the first loop 120, arranged in series and parallel with each other, and a second electrical component 118 on the second loop 122. For example, in one embodiment, the electrical system 114 is a phased antenna array radar system. The second electrical component 118 is the antenna array, which can operate at a relatively high temperature. The first components 116, which operate at a lower temperature than the array, include a processor 176a, a receiver 176b, and a power supply 176c.

These components 176a-c are connected along the first liquid loop 120 in series and parallel with each other. The embodiment shown in FIG. 2 is one example of how these various components can be arranged. In this embodiment, the liquid loop 120 is divided into two parallel paths at junction 177. One path flows to the processor 176a and one path to the receiver 176b. The receiver 176b and the power supply 176c are connected in series on the second path. The flow paths converge at junction 179, and from there the loop exits the electrical system 114.

The particular arrangement of junctions 177, 179 and parallel and series flow paths shown in FIG. 2 is one example, and in other embodiments the components in the first group 116 are arranged in other combinations. The arrangement of these components depends on the operating temperature and the temperature tolerance of each, as well as the volume and flow rate of the coolant 140a. The junctions 177, 179 can be used to divide the coolant 140a into the desired ratios for the different flow paths. For example, in one embodiment, the first loop 120 includes coolant that flows at a flow rate of approximately 2 gallons per minute (gpm). At junction 177, the flow divides in the appropriate ratio, with one part flowing to the processor 176a and the other part to the receiver 176b and power supply 176c. This is just one example of the division of flow among the thermally sensitive components 116, and the flow ratio can be varied depending on the temperature requirements of the individual components. The flow can be adjusted to provide a higher coolant flow rate to the more sensitive and/or lower-temperature components.

The junctions 177, 179 can be active or passive elements. In one embodiment the junctions are valves that can be controlled to vary the amount of coolant flowing through each flow path. In another embodiment the junctions are passive T-fittings allowing the flow to divide at that point.

The use of two separate liquid loops 120, 122 enables each loop to have different characteristics. For example, a different coolant could be used in each loop according to the temperature requirements of the respective components 116, 118. Different coolant volumes and flow rates can also be provided in each loop. In one embodiment, the first loop 120 passing through the receiver, processor, and power supply units operates at a flow rate of 2 gallons per minute, and the second loop 122 passing through the array operates at 4 gallons per minute. In other embodiments the flow rates vary depending on the hardware and the heat load. A low power application may utilize as little as 1/10 gallon per minute, while a high power application may utilize 10-20 gallons per minute. The flow rate may be about ½ to 1 gallon per minute per kilowatt of heat generated.

FIG. 2 also shows that the flow control units 142, 144 can be provided as separate units outside of the liquid-to-air cooling unit 112. In this embodiment, the flow control units 142, 144 are connected in each loop 120, 122 between the electrical components 116, 118 and the heat exchangers 136, 138, respectively. In other embodiments, the flow control units 142, 144 may be connected downstream of the heat exchangers, before the loop passes to the electrical components 116, 118. In other embodiments, the various sub-components 146a/b, 148a/b, 150a/b of the flow control units may be divided out and located at various points along the loops 120, 122, and they may be included inside of the housing of the cooling unit 112 or separate from it.

The liquid coolant 40a, 40b, 140a, 140b can be selected from many available types of liquid coolant for cooling electrical systems. In one embodiment, the coolant is a polyalphaolefin (PAO), or water, or a mixture of ethylene-glycol and water, or fuel (such as jet fuel when the platform is an aircraft), or any other suitable refrigerant, liquid coolant, or coolant mixture.

Although not shown in detail, various ducts 80, tubing, and/or other airflow passages may be connected to or used within the liquid-to-air cooling unit 12, 112 to route airflow through the unit, and to and from the platform.

In one embodiment the air-cooled platform is an aircraft such as an airborne fighter, surveillance, or reconnaissance aircraft that can be manned or unmanned. However the invention is not limited to aircraft, and may be used on other air-cooled platforms, including but not limited to ground vehicles, stationary ground systems, watercraft, sensor equipment, and other systems. While the platform is described as air-cooled, it could include both liquid and air cooling, with insufficient liquid cooling for the electrical system 14, 114. In one embodiment the liquid cooled electrical system 14 is a phased antenna array radar system. In other embodiments the system 14 is another type of electronic system, such as other radar systems, optical or other sensor systems, weapon systems, laser systems, electromagnetic energy systems, and other complex electronic systems. In one embodiment, the liquid-to-air cooling unit enables an existing platform (such as an early generation fighter aircraft) with limited ram-air or air cycle machine air cooling to be upgraded with a new liquid-cooled electrical system 14, such as a phased array, radar system. In another embodiment, the liquid-to-air cooling unit is installed on a new platform, rather than as an upgrade of an existing platform.

Figure 3:
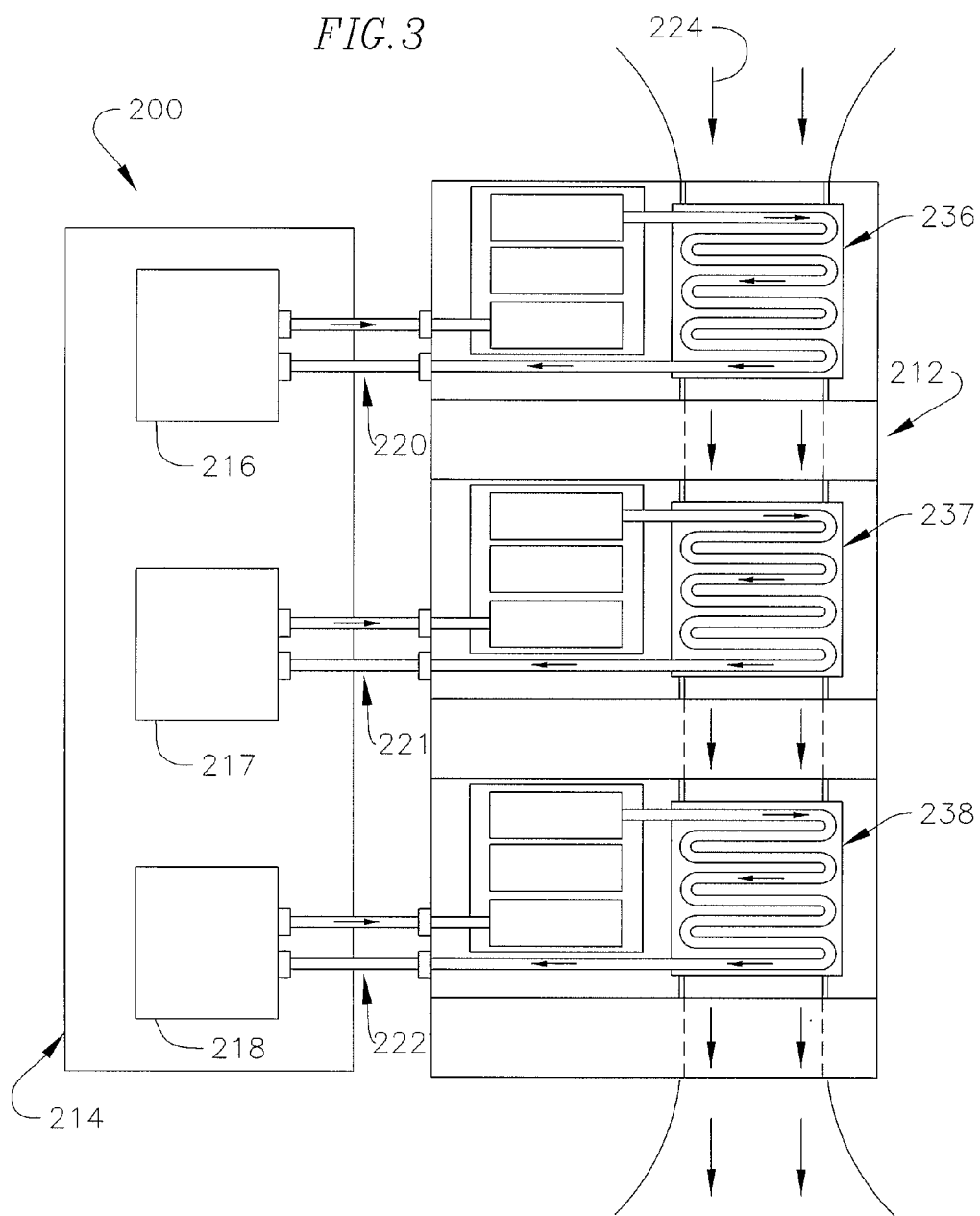
FIG. 3 is a schematic view of a liquid cooling system according to another embodiment of the invention.

FIGS. 1-2 show cooling systems 10, 100 with two liquid cooling loops. In other embodiments more than two liquid cooling loops are included. For example, as shown in FIG. 3, in one embodiment an electrical system 214 includes electrical components that are grouped into three groups 216, 217, 218 according to temperature, each group connected on its own liquid flow loop 220, 221, 222 respectively. Each liquid loop flows through a heat exchanger (236, 237, 238 respectively) in the liquid cooling unit 212. The heat exchangers 236, 237, 238 are arranged in series in the liquid cooling unit 212, in order of increasing temperature. That is, the first heat exchanger 237 is connected to the liquid loop 220 for the lowest-temperature (more thermally sensitive) components 216, the second heat exchanger 237 is connected to the liquid loop 221 with the next highest temperature components 217, and the third heat exchanger 238 is connected to the liquid loop 222 with the highest temperature components 218. The air flow 224 passes through the first, second, and third heat exchangers in that order. In other embodiments, more than three loops are provided.

Any number of liquid loops can be provided based on the number of groups of electrical components in the liquid-cooled electrical system. As mentioned above, the electrical components are grouped according to temperature. In one embodiment components that operate at temperatures within a range of about 20° C. are grouped together. In another embodiment this range is about 30° C.

An example of a multiple loop liquid cooling system on an aircraft platform was studied to assess the improvement in cooling compared to a single liquid loop system, given the same available on-board air flow. By separating the liquid cooling into two loops, arranging the loops in series in the air flow, and isolating the thermally sensitive components on the first loop from the higher temperature components on the second loop, the heat rejection to the limited on-board air flow is improved. In one embodiment, a multiple loop system (with a first loop for the thermally sensitive components and a second loop for the thermally robust components) provides cooling as follows: the coolant in the first loop operates at approximately 20-30° C., and the coolant in the second loop operates at approximately 60-80° C. In the example studied, isolating the first loop from the second provided significantly improved cooling for the first loop without significantly increasing the component temperatures in the second loop. For example, the increase in temperature in the second loop was less than 1° C. (compared to a single loop system) in the example studied.

According to another embodiment of the invention, a method is provided for cooling a liquid-cooled electrical system on a platform with air cooling. The method includes providing an electrical system comprising first and second electrical components; providing a cooling unit comprising an air flow path; passing a first liquid coolant through a first liquid loop through the first electrical component; passing a second liquid coolant through a second liquid loop through the second electrical component; and passing air flow through the air flow path of the cooling unit. The air flow path passes over the first liquid loop and the second liquid loop in series, with the second liquid loop downstream of the first liquid loop. The first liquid loop is substantially thermally isolated from the second liquid loop. The method further includes exchanging heat from the first liquid loop to the air flow, producing an intermediate heated air flow, and then exchanging heat from the second liquid loop to the intermediate heated air flow.

Although the present invention has been described and illustrated in respect to exemplary embodiments, it is to be understood that it is not to be so limited, and changes and modifications may be made therein which are within the full intended scope of this invention as hereinafter claimed. For example, various combinations of components (16, 18, 116, 118, 216, 217, 218) can be arranged on multiple liquid loops.

What is claimed is:

1. A liquid-cooled system for a platform with air cooling, comprising:
    an electrical system comprising first and second electrical assemblies, the first electrical assembly comprising a first electrical component, the second electrical assembly comprising a second electrical component;
    a cooling unit housing comprising an air inlet duct, an air outlet duct, a first heat exchanger comprising a first air inlet and a first air outlet, and a second heat exchanger comprising a second air inlet and a second air outlet, the second heat exchanger being arranged in series with the first heat exchanger, wherein air from the air inlet duct flows into the first air inlet of the first heat exchanger and out of the first air outlet of the first heat exchanger, and wherein air from the first air outlet of the first heat exchanger flows into the second air inlet of the second heat exchanger and out of the second air outlet of the second heat exchanger to the air outlet duct;
    a first liquid loop passing through the first heat exchanger and the first electrical assembly;
    a first controllable pump for causing fluid circulation throughout the first liquid loop and the first electrical assembly;
    a second liquid loop passing through the second heat exchanger and the second electrical assembly;
    a second controllable pump for causing fluid circulation throughout the second liquid loop and the second electrical assembly; and
    a thermal barrier comprising a non-metal material between the first and second heat exchangers, the thermal barrier being separate from the air inlet duct and the air outlet duct, the thermal barrier defining a passage configured to contain and direct air flow between the first outlet of the first heat exchanger and the second inlet of the second heat exchanger, the thermal barrier comprising a portion extending continuously from the passage to a position between the first and second controllable pumps,
    wherein the first electrical component is more thermally sensitive than the second electrical component,
    wherein the first electrical component and the first heat exchanger are proximate to the air inlet duct and the second electrical component and the second heat exchanger are proximate to the air outlet duct, and
    wherein the first liquid loop is substantially thermally isolated from the second liquid loop by the thermal barrier.

2. The liquid-cooled system of claim 1, wherein the first liquid loop comprises a first coolant that is cooled to a first temperature, and the second liquid loop comprises a second coolant that is cooled to a second temperature, and wherein the first temperature is less than the second temperature.

3. The liquid-cooled system of claim 2, wherein the first temperature is at least 20° C. less than the second temperature.

4. The liquid-cooled system of claim 1, wherein the first electrical assembly comprises a plurality of electrical assemblies through which the first liquid loop passes in series.

5. The liquid-cooled system of claim 1, wherein the first electrical assembly comprises a plurality of electrical assemblies through which the first liquid loop passes in parallel.

6. The liquid-cooled system of claim 1, wherein the first electrical assembly comprises a plurality of electrical assemblies through which the first liquid loop passes in both series and parallel.

7. The liquid-cooled system of claim 1, wherein the electrical system further comprises a third electrical assembly, and wherein the cooling unit housing further comprises a third heat exchanger in the air flow path downstream of the second heat exchanger, and further comprising a third liquid loop passing through the third heat exchanger and the third electrical assembly, and wherein the third liquid loop is substantially thermally isolated from the first and second liquid loops.

8. The liquid-cooled system of claim 1, wherein the cooling unit housing further comprises first and second flow control units through which the first and second liquid loops pass in series with the first and second heat exchangers, respectively.

9. The liquid-cooled system of claim 8, wherein the first and second flow control units each comprise the first or second controllable pump and at least one of a filter or an accumulator.

10. A liquid cooling unit housing for an electrical system having first and second electrical assemblies on an air-cooled platform, the liquid cooling unit housing comprising:
 an air inlet duct;
 an air outlet duct;
 a first liquid inlet and a first liquid outlet, for connection to such first electrical assembly;
 a second liquid inlet and a second liquid outlet, for connection to such second electrical assembly;
 a first heat exchanger comprising a first air inlet and a first air outlet;
 a second heat exchanger comprising a second air inlet and a second air outlet, the second heat exchanger being arranged in series with the first heat exchanger, wherein air from the air inlet duct flows into the first air inlet of the first heat exchanger and out of the first air outlet of the first heat exchanger, and wherein air from the first air outlet of the first heat exchanger flows into the second air inlet of the second heat exchanger and out of the second air outlet of the second heat exchanger to the air outlet duct;
 a first liquid flow path from the first liquid inlet through the first heat exchanger to the first liquid outlet;
 a first controllable pump for causing fluid circulation throughout the first liquid flow path and the first electrical assembly;
 a second liquid flow path from the second liquid inlet through the second heat exchanger to the second liquid outlet;
 a second controllable pump for causing fluid circulation throughout the second liquid flow path and the second electrical assembly; and
 a thermal barrier comprising a non-metal material between the first and second heat exchangers, the thermal barrier being separate from the air inlet duct and the air outlet duct, the thermal barrier defining a passage configured to contain and direct the air flow between the first outlet of the first heat exchanger and the second inlet of the second heat exchanger, the barrier comprising a portion extending continuously from the passage to a position between the first and second controllable pumps,
 wherein the first liquid flow path is substantially thermally isolated from the second liquid flow path by the thermal barrier.

11. The liquid cooling housing unit of claim 10, further comprising first and second flow control units in the first and second liquid flow paths, respectively.

12. A method for cooling a liquid-cooled electrical system on a platform with air cooling, comprising:
 providing an electrical system comprising first and second electrical assemblies, the first electrical assembly comprising a first electrical component, the second electrical assembly comprising a second electrical component;
 providing a cooling unit housing comprising an air inlet duct and an air outlet duct;
 passing a first liquid coolant through a first liquid loop and through the first electrical assembly using a first controllable pump;
 passing a second liquid coolant through a second liquid loop and through the second electrical assembly using a second controllable pump; and
 passing an air flow through the air flow path of the cooling unit housing,
 wherein the air flow path passes over the first liquid loop and the second liquid loop in series, with the second liquid loop downstream of the first liquid loop, and
 wherein the first liquid loop is substantially thermally isolated from the second liquid loop by a thermal barrier comprising a non-metal material between the first liquid loop and the second liquid loop, the thermal barrier being separate from the air inlet duct and the air outlet duct, the thermal barrier defining a passage that contains and directs the air flow from the first liquid loop to the second liquid loop, the thermal barrier comprising a portion extending continuously from the passage to a position between the first and second controllable pumps.

13. The method of claim 12, further comprising exchanging heat from the first liquid loop to the air flow, producing an intermediate heated air flow, and exchanging heat from the second liquid loop to the intermediate heated air flow.

14. The liquid-cooled system of claim 1, wherein the barrier comprises a flexible bellows.

15. The liquid-cooled system of claim 1, wherein the first electrical assembly comprises a phased antenna array radar system and the second electrical assembly comprises an antenna array.

* * * * *